(12) United States Patent
Liao et al.

(10) Patent No.: US 12,740,379 B2
(45) Date of Patent: Sep. 15, 2026

(54) VACUUM WAFER CHUCK FOR MANUFACTURING SEMICONDUCTOR DEVICES

(71) Applicant: Taiwan Semiconductor Manufacturing Co., Ltd., Hsinchu City (TW)

(72) Inventors: Chung-Hsien Liao, Hsinchu City (TW); Chin-Shen Hsieh, Hsin-Chu (CN)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 336 days.

(21) Appl. No.: 18/412,358

(22) Filed: Jan. 12, 2024

(65) Prior Publication Data

US 2024/0153810 A1 May 9, 2024

Related U.S. Application Data

(62) Division of application No. 17/736,926, filed on May 4, 2022, now Pat. No. 11,901,215, which is a division of application No. 16/870,336, filed on May 8, 2020, now Pat. No. 11,335,585.

(51) Int. Cl.
*H10P 72/78* (2026.01)
*B25B 11/00* (2006.01)

(52) U.S. Cl.
CPC ............ *H10P 72/78* (2026.01); *B25B 11/005* (2013.01)

(58) Field of Classification Search
CPC .. H10P 72/78; H10P 72/7612; H10P 72/3202; H10P 72/7624
See application file for complete search history.

(56) References Cited

U.S. PATENT DOCUMENTS

| | | | |
|---|---|---|---|
| 5,669,977 A | 9/1997 | Shufflebotham | |
| 2013/0202388 A1 | 8/2013 | Hayashi et al. | |
| 2018/0350654 A1 * | 12/2018 | Forderhase | H10P 72/7612 |
| 2021/0225687 A1 | 7/2021 | Malik et al. | |
| 2021/0249298 A1 | 8/2021 | Lin et al. | |

* cited by examiner

*Primary Examiner* — Jason L Vaughan
*Assistant Examiner* — Amanda Kreiling
(74) *Attorney, Agent, or Firm* — The Marbury Law Group, PLLC

(57) ABSTRACT

Disclosed is a substrate displacing assembly so as to improve its durability during a semiconductor processing. In one embodiment, a semiconductor manufacturing system, includes, a substrate holder, wherein the substrate holder is configured with a plurality of pins; and a substrate displacing assembly for displacing a substrate on the substrate holder in a first direction perpendicular to the top surface of the substrate holder through the plurality of pins, wherein the substrate displacing assembly comprises a pair of load forks, a coupler and a driving shaft, wherein the pair of load forks comprises a fork region and a base region, wherein the coupler is mechanically coupled to the base region through at least one first joining screw extending in the first direction, wherein the coupler is further mechanically coupled to the driving shaft through a second joining screw extending in the first direction.

20 Claims, 7 Drawing Sheets

VACUUM WAFER CHUCK FOR MANUFACTURING SEMICONDUCTOR DEVICES

RELATED APPLICATIONS

This application is a division of U.S. patent application Ser. No. 17/736,926, filed May 4, 2022, which is a division of U.S. patent application Ser. No. 16/870,336, filed May 8, 2020, the entireties of each are incorporated by reference herein.

BACKGROUND

In the semiconductor integrated circuit (IC) industry, there is a continuing demand for smaller device dimensions and higher circuit packing densities. This demand has driven the semiconductor industry to develop new materials and complex processes. For example, when a feature (e.g., a gate/drain/source feature of a transistor, a horizontal interconnect line, or a vertical via, etc.) is to be formed on a wafer, the wafer typically goes through mechanisms which comprises multiple processing stations typically using different process tools to perform various operations such as cleaning, photolithography, dielectric deposition, dry/wet etching, and metal deposition, for example. However, the mechanisms for lifting and moving substrates in the processing stations often face frequent mechanical failure affecting the manufacturing yield. Thus, existing mechanisms are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

DETAILED DESCRIPTION OF EXEMPLARY EMBODIMENTS

Figure 1A:
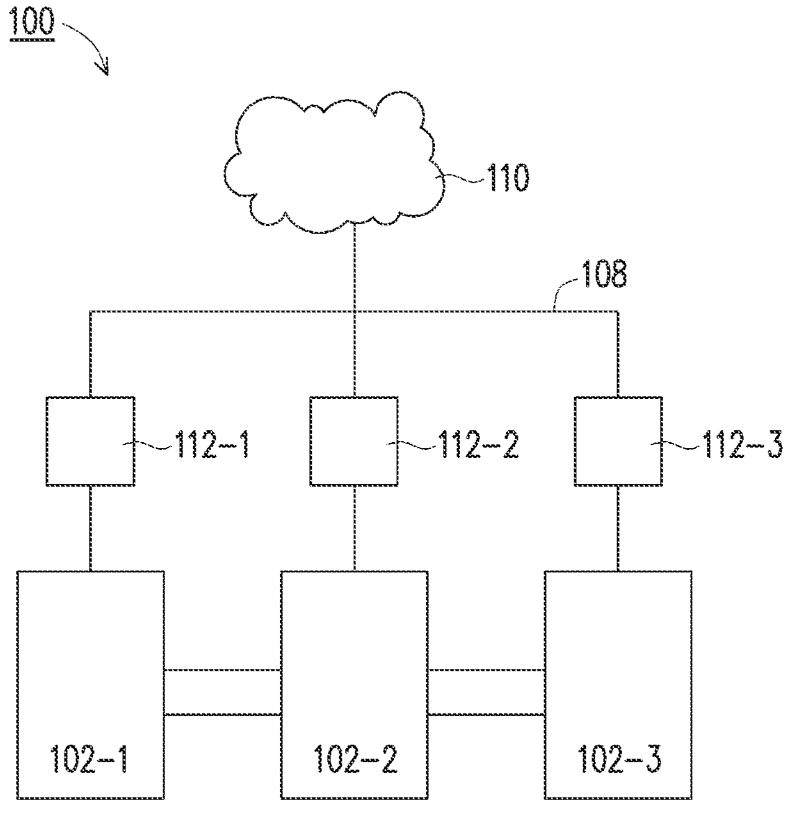
FIG. 1A illustrates an exemplary block diagram of a semiconductor processing system, in accordance with some embodiments of present disclosure.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The presented disclosure provides various embodiments of a method and system for lifting and moving substrate in a processing station with improved reliability. Accordingly, the above-mentioned issues may be advantageously avoided.

This description of the exemplary embodiments is set to be understood in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

FIG. 1A illustrates an exemplary block diagram of a semiconductor processing system 100, in accordance with some embodiments of present disclosure. It is noted that the semiconductor processing system (hereinafter "system") 100 is merely an example, and is not intended to limit the present disclosure. Accordingly, it is understood that additional functional blocks may be provided in or coupled to the semiconductor processing system 100 of FIG. 1, and that some other functional blocks may only be briefly described herein.

In the illustrated embodiment, the system 100 comprises a plurality of processing stations for Integrated Circuit (IC) manufacturing processes, e.g., a first processing station 102-1, a second processing station 102-2, and a third processing station 102-3. Examples of the IC manufacturing processes conducted in the processing stations 102-1, 102-2, and 102-3 include cleaning, photolithography, wet etching, dry etching, dielectric deposition, metal deposition, and may include any other semiconductor processes known in the art. In some embodiments, the first processing station 102-1 is a photolithography station, the second processing station 102-2 is a plasma processing station; and the third processing station 102-3 is a deposition station. At least one feature can be created in each processing station 102-1/102-2/102-3 including a photoresist pattern, a metal contact, an etch trench, an isolation, a via structure/hole, an interconnect line, and the like.

Each of the processing stations 102-1/102-2/102-3 comprises a substrate holder (not shown) for holding a substrate during the semiconductor manufacturing process. In some embodiments, the substrate holder may comprises a plurality of pins. In some other embodiments, the substrate holder may further comprises at least one vacuum groove for securing the substrate on the substrate holder. In some embodiments, the plurality of pins are configured on the substrate holder which can be lifted by a substrate displacing assembly configured at the bottom side of the substrate holder. In some embodiments, the substrate displacing assembly configured on the bottom side and below the substrate holder, wherein the position of the substrate displacing assembly can be controlled through a coupled driving shaft, by selectively moving the plurality of pins up and down so as to lift up or set down the substrate from/to the substrate holder. In some embodiments, the substrate displacing assembly comprises inner materials, such as ceramic, graphite, etc.

In some embodiments, the substrate holder may further comprise at least one temperature control/sensing unit 205. In some embodiments, a temperature control/sensing unit 205 comprises at least one heating element, at least one cooling element and at least one temperature sensing element.

In some embodiments, a heating element can be a Peltier device and/or resistive heater such as polyimide heater, silicone rubber heater, mica heater, metal heater (e.g. W, Ni/Cr alloy, Mo or Ta), ceramic heater (e.g. WC), semiconductor heater, carbon heater, or any other suitable type of heating element as desired. The heating element can be implemented in various designs or configurations, such as being screen printed, wire wound, etched foil heaters, or any other suitable design as desired.

In some embodiments, a cooling element is configured in the vacuum chuck to control the temperature of the substrate holder so as to control the temperature of the warped substrate. In some embodiments, liquid or gaseous coolant passing through the cooling element can be chilled with an external chiller (not shown) for greater cooling effect, and can be recirculated for greater efficiency. The external chiller cooling and recirculating a coolant fluid can be controlled by the controller 112. Faster cooling rate is possible if a chiller is used to cool the coolant fluid to a temperature below atmospheric, in accordance with some embodiments. In some embodiments, the cooling element may not be necessary. In some embodiments, the cooling element can be cryogenic.

In some embodiments, the sensing element is configured in the substrate holder for detecting local temperature of the vacuum chuck through a temperature sensing circuit. This is particularly useful in regulating the temperature of the substrate with a desired time response. In some embodiments, different types of sensing elements can be implemented, including contact and non-contact temperature sensors depending on the desired performance, e.g., detection range, sensitivity, accuracy, response time, repeatability, size, power consumption, cost, etc. In some embodiments, a contact type temperature sensor can be a thermostat consisting two different metals (e.g., nickel, copper, tungsten, aluminum, etc.), a thermistor typically consisting ceramic materials (e.g., oxides of nickel, manganese, cobalt, etc.), a thin film resistive sensor typically consisting thin high-purity conducting metals (e.g., platinum, copper, nickel, etc.), a thermocouple consisting two different metals (e.g., copper, iron, a variety of metal alloys, etc.) and two junctions, semiconductor junctions sensors, infra-red radiation sensor and the like. In some embodiments, the heating elements can be also function as temperature sensing elements.

The local computers 112-1, 112-2 and 112-3 are each coupled to a remote computer resource 110 through a connection 108. In some embodiments, the connection 108 may include an Ethernet cable, an optical fiber, a wireless communication media, and/or other networks known in the art. In some embodiments, the remote computer resource 110 includes a computer network, one or more servers, applications, and/or data centers, generally known as the “cloud” or cloud computing. It should be understood that other connections and intermediate circuits can be deployed between the local computers 112-1, 112-2 and 112-3 associated with the processing stations 102-1, 102-2 and 102-3, and the remote computer resource 110 to facilitate interconnection. In some embodiments, the local computer 116 configures processing conditions and provides control signals to the corresponding processing station 102.

Although the system 100 in the illustrated embodiment of FIG. 1 includes only three processing stations 102-1/102-2/102-3, three local computers 112-1/112-2/112-3, and one remote computer resource 110, it is understood that the embodiment of FIG. 1 is merely provided for illustration purposes. The system 100 may include any desired number of processing stations while remaining within the scope of the present disclosure.

Figure 1B:
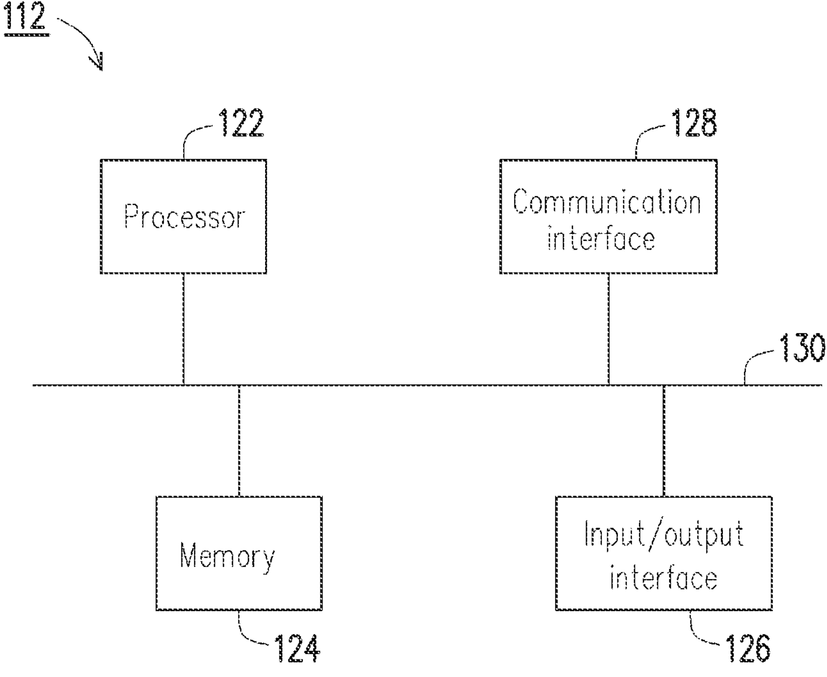
FIG. 1B illustrates an exemplary block diagram of a local computer which may be used for implementing the methods described herein, in accordance with some embodiments of the invention.

FIG. 1B illustrates an exemplary block diagram of a local computer 112 which may be used for implementing the methods described herein, in accordance with some embodiments of the invention. It is noted that the local computer 112 is merely an example, and is not intended to limit the invention. Accordingly, it is understood that additional functional blocks may be provided in or coupled to the computer apparatus of FIG. 1B, and that some other functional blocks may be omitted or only briefly described herein. It should be also noted that the functionalities provided in each of the components and modules of the local computer 112 can be combined or separated into one or more modules.

In the illustrated embodiment, the local computer 112 comprises a processor 122, a memory 124, an input/output interface 126, a communications interface 128, and a system bus 130, in accordance with some embodiments. The processor 122 may comprise any processing circuitry operative to control the operations of the processing station 102. In various aspects, the processor 122 may be implemented as a general purpose processor, a chip multiprocessor (CMP), a dedicated processor, an embedded processor, a digital signal processor (DSP), a network processor, an input/output (I/O) processor, a media access control (MAC) processor, a radio baseband processor, a co-processor, a microprocessor such as a complex instruction set computer (CISC) microprocessor, a reduced instruction set computing (RISC) microprocessor, and/or a very long instruction word (VLIW) microprocessor, or other processing device. The processor 122 also may be implemented by a controller, a microcontroller, an application specific integrated circuit (ASIC), a field programmable gate array (FPGA), a programmable logic device (PLD), and so forth.

In various aspects, the processor 122 may be arranged to run an operating system (OS) and various applications. Examples of an OS comprise, for example, operating systems generally known under the trade name of Apple OS, Microsoft Windows OS, Android OS, and any other proprietary or open source OS. Examples of applications comprise, for example, a telephone application, a camera (e.g., digital camera, video camera) application, a browser application, a multimedia player application, a gaming application, a messaging application (e.g., email, short message, multimedia), a viewer application, and so forth.

In some embodiments, at least one non-transitory computer-readable storage medium is provided having computer-executable instructions embodied thereon, wherein, when executed by at least one processor, the computer-executable instructions cause the at least one processor to perform embodiments of the methods described herein. This computer-readable storage medium can be embodied in the memory 124.

In some embodiments, the memory 124 may comprise any machine-readable or computer-readable media capable of storing data, including both volatile/non-volatile memory and removable/non-removable memory. The memory 124 may comprise at least one non-volatile memory unit. The non-volatile memory unit is capable of storing one or more software programs. The software programs may contain, for example, applications, user data, device data, and/or configuration data, or combinations therefore, to name only a few. The software programs may contain instructions executable by the various components of the robot controller of the tray-handling system 704.

For example, memory may comprise read-only memory (ROM), random-access memory (RAM), dynamic RAM (DRAM), Double-Data-Rate DRAM (DDR-RAM), synchronous DRAM (SDRAM), static RAM (SRAM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory (e.g., ovonic memory), ferroelectric memory, silicon-oxide-nitride-oxide-silicon (SONOS) memory, disk memory (e.g., floppy disk, hard drive, optical disk, magnetic disk), or card (e.g., magnetic card, optical card), or any other type of media suitable for storing information.

In one embodiment, the memory 124 may contain an instruction set, in the form of a file for executing a method of generating one or more timing libraries as described herein. The instruction set may be stored in any acceptable form of machine-readable instructions, including source code or various appropriate programming languages. Some examples of programming languages that may be used to store the instruction set comprise, but are not limited to: Java, C, C++, C#, Python, Objective-C, Visual Basic, or .NET programming. In some embodiments a compiler or interpreter is comprised to convert the instruction set into machine executable code for execution by the processor.

In some embodiments, the I/O interface 126 may comprise any suitable mechanism or component to enable a user to provide input to the processing station 102 or to provide output to the user. For example, the I/O interface 126 may comprise any suitable input mechanism, including but not limited to, a button, keypad, keyboard, click wheel, touch screen, or motion sensor. In some embodiments, the I/O interface 126 may comprise a capacitive sensing mechanism, or a multi-touch capacitive sensing mechanism (e.g., a touchscreen).

In some embodiments, the I/O interface 126 may comprise a visual peripheral output device for providing a display visible to the user. For example, the visual peripheral output device may comprise a screen such as, for example, a Liquid Crystal Display (LCD) screen, incorporated into the local computer 112. As another example, the visual peripheral output device may comprise a movable display or projecting system for providing a display of content on a surface remote the local computer 112. In some embodiments, the visual peripheral output device can comprise a coder/decoder, also known as a Codec, to convert digital media data into analog signals. For example, the visual peripheral output device may comprise video Codecs, audio Codecs, or any other suitable type of Codec.

The visual peripheral output device also may comprise display drivers, circuitry for driving display drivers, or both. The visual peripheral output device may be operative to display content under the direction of the processor. For example, the visual peripheral output device may be able to play media playback information, application screens for applications implemented on the computer apparatus, information regarding ongoing communications operations, information regarding incoming communications requests, or device operation screens, to name only a few.

In some embodiments, the communications interface 128 may comprise any suitable hardware, software, or combination of hardware and software that is capable of coupling the local computer 112 to one or more networks and/or additional devices. The communications interface 128 may be arranged to operate with any suitable technique for controlling information signals using a desired set of communications protocols, services or operating procedures. The communications interface 128 may comprise the appropriate physical connectors to connect with a corresponding communications medium, whether wired or wireless.

Systems and methods of communication comprise a network, in accordance with some embodiments. In various aspects, the network may comprise local area networks (LAN) as well as wide area networks (WAN) including without limitation Internet, wired channels, wireless channels, communication devices including telephones, computers, wire, radio, optical or other electromagnetic channels, and combinations thereof, including other devices and/or components capable of/associated with communicating data. For example, the communication environments comprise in-body communications, various devices, and various modes of communications such as wireless communications, wired communications, and combinations of the same.

Wireless communication modes comprise any mode of communication between points (e.g., nodes) that utilize, at least in part, wireless technology including various protocols and combinations of protocols associated with wireless transmission, data, and devices. The points comprise, for example, wireless devices such as wireless headsets, audio and multimedia devices and equipment, such as audio players and multimedia players, telephones, including mobile telephones and cordless telephones, and computers and computer-related devices and components, such as printers, network-connected machinery such as a circuit generating system, and/or any other suitable device or third-party device.

Wired communication modes comprise any mode of communication between points that utilize wired technology including various protocols and combinations of protocols associated with wired transmission, data, and devices. The points comprise, for example, devices such as audio and multimedia devices and equipment, such as audio players and multimedia players, telephones, including mobile telephones and cordless telephones, and computers and computer-related devices and components, such as printers, network-connected machinery, and/or any other suitable device or third-party device. In various implementations, the wired communication modules may communicate in accordance with a number of wired protocols. Examples of wired protocols may comprise Universal Serial Bus (USB) communication, RS-232, RS-422, RS-423, RS-485 serial protocols, FireWire, Ethernet, Fiber Channel, MIDI, ATA, Serial ATA, PCI Express, T-1 (and variants), Industry Standard Architecture (ISA) parallel communication, Small Computer System Interface (SCSI) communication, or Peripheral Component Interconnect (PCI) communication, to name only a few examples.

Accordingly, in various aspects, the communications interface 128 may comprise one or more interfaces such as, for example, a wireless communications interface, a wired communications interface, a network interface, a transmit interface, a receive interface, a media interface, a system interface, a component interface, a switching interface, a chip interface, a controller, and so forth. When implemented by a wireless device or within wireless system, for example, the communications interface may comprise a wireless interface comprising one or more antennas, transmitters, receivers, transceivers, amplifiers, filters, control logic, and so forth.

In various embodiments, the communications interface 128 may provide voice and/or data communications functionality in accordance a number of wireless protocols. Examples of wireless protocols may comprise various wireless local area network (WLAN) protocols, including the Institute of Electrical and Electronics Engineers (IEEE) 802.xx series of protocols, such as IEEE 802.11a/b/g/n, IEEE 802.16, IEEE 802.20, and so forth. Other examples of wireless protocols may comprise various wireless wide area network (WWAN) protocols, such as GSM cellular radiotelephone system protocols with GPRS, CDMA cellular radiotelephone communication systems with 1×RTT, EDGE systems, EV-DO systems, EV-DV systems, HSDPA systems, and so forth. Further examples of wireless protocols may comprise wireless personal area network (PAN) protocols, such as an Infrared protocol, a protocol from the Bluetooth Special Interest Group (SIG) series of protocols, including Bluetooth Specification versions v1.0, v1.1, v1.2, v2.0, v2.0 with Enhanced Data Rate (EDR), as well as one or more Bluetooth Profiles, and so forth. Yet another example of wireless protocols may comprise near-field communication techniques and protocols, such as electromagnetic induction (EMI) techniques. An example of EMI techniques may comprise passive or active radio-frequency identification (RFID) protocols and devices. Other suitable protocols may comprise Ultra Wide Band (UWB), Digital Office (DO), Digital Home, Trusted Platform Module (TPM), ZigBee, and so forth.

The system bus 130 couples the processor 122, the memory 124, the I/O interface 126, and the communication interface 128 to one another, as necessary. The system bus 130 can be any of several types of bus structure(s) including a memory bus or memory controller, a peripheral bus or external bus, and/or a local bus using any variety of available bus architectures including, but not limited to, 9-bit bus, Industrial Standard Architecture (ISA), Micro-Channel Architecture (MCA), Extended ISA (EISA), Intelligent Drive Electronics (IDE), VESA Local Bus (VLB), Personal Computer Memory Card International Association (PCMCIA) Bus, Small Computer System Interface (SCSI) or other proprietary bus, or any custom bus suitable for computing device applications.

Figure 2A:
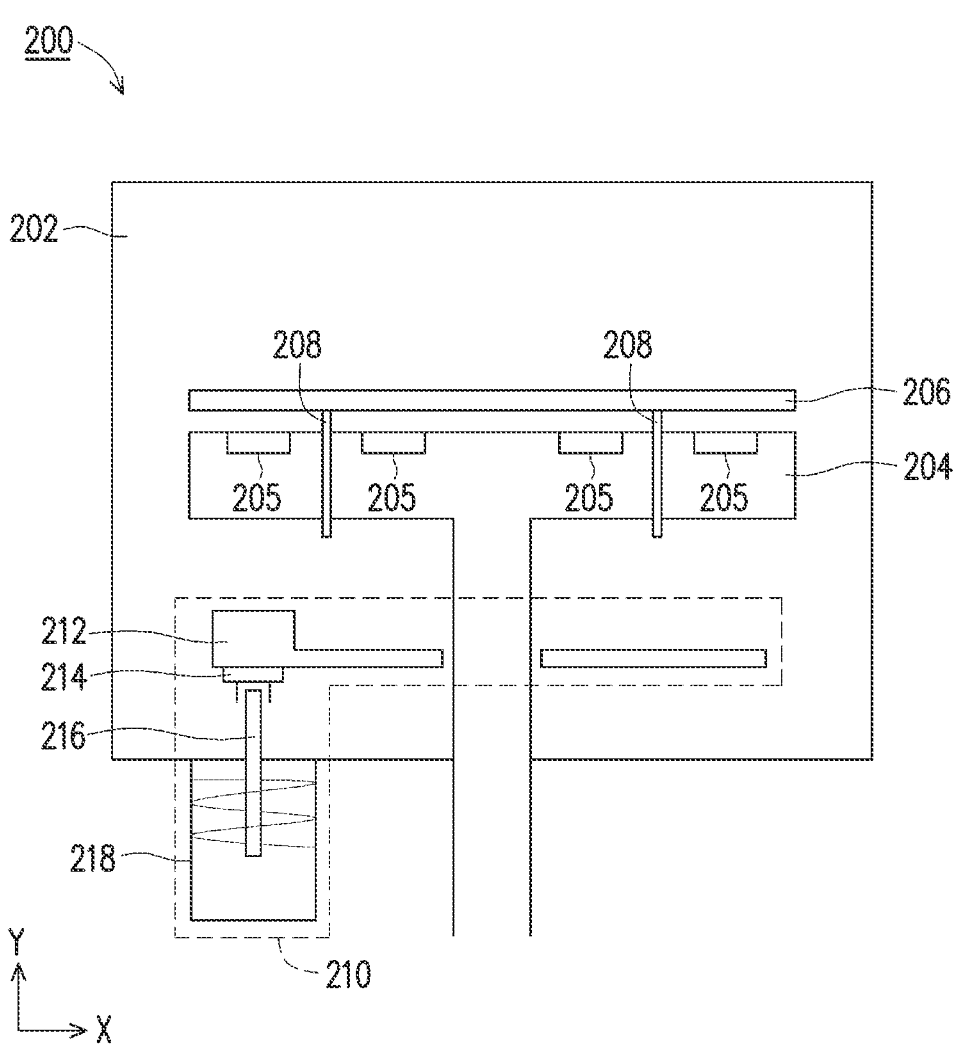
FIG. 2A illustrates an exemplary semiconductor processing system, in accordance with some embodiments of the present disclosure.

FIG. 2A illustrates an exemplary semiconductor processing system 200, in accordance with some embodiments of the present disclosure. In the illustrated embodiment, the semiconductor processing system 200 comprises a chamber 202, a substrate holder 204, and a substrate displacing assembly 210. In some embodiments, the substrate holder 204 is for holding and securing a semiconductor wafer 206 during a semiconductor manufacturing process performed in the chamber 202. Examples of the semiconductor manufacturing process conducted in the chamber 202 includes at least one of the following: cleaning, photolithography, wet etching, dry etching, dielectric deposition, metal deposition, and any other semiconductor processes known in the art. In some embodiments, the chamber 202 is for depositing a semiconductor layer on the semiconductor substrate 206 using a chemical vapor deposition (CVD) process.

In the illustrated embodiment, the substrate holder 204 comprises a plurality of pins 208 extending from the top surface to the back surface of the substrate holder 204. In some embodiments, each of the plurality of pins 208 may be one of the following: a retractable spring loaded guide pin, a self-contained pin, a through pin and other type of pins known in the art. In some embodiments, each of the plurality of pins 208 is made of stainless steel, alumina, copper, plastic, or ceramic, depending on the specific conditions of the semiconductor manufacturing process conducted in the chamber 202. In the illustrated embodiments, the plurality of pins 208 configured in the substrate holder 204 can be activated through the back of the substrate holder 204 in order to lift up the substrate 206 from the substrate holder 204 or set down the substrate 206 to the substrate holder 204.

In the illustrated embodiment, the substrate displacing assembly 210 is configured below the substrate holder 204 for activating the plurality of pins 208 in the y direction. The substrate displacing assembly 210, in the illustrated embodiment, comprises a pair of load forks 212, a coupler 214, a driving shaft 216, and a driving mechanism 218. In some embodiments, the pair of load forks 212 is coupled to the driving shaft 216 through the coupler 214, wherein the driving shaft 216 is further mechanically coupled to the driving mechanism 218. In some embodiments, the driving mechanism 218 is configured outside of the chamber 202. In some embodiments, the driving mechanism 218 comprises a linear motor and a ball screw, which can transfer a rotation motion to a linear motion of the pair of load forks 212 in the y direction.

Figure 2B:
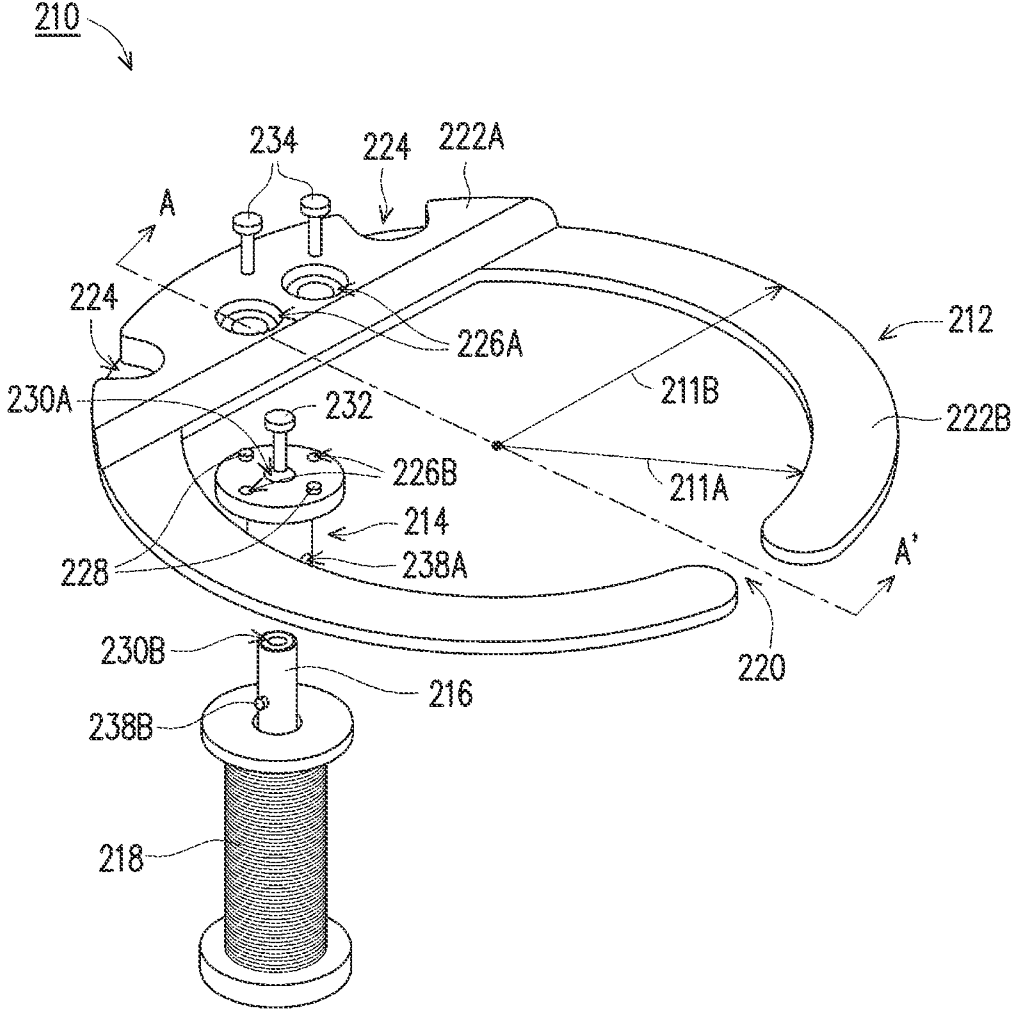
FIGS. 2B-2C illustrates exemplary perspective view and side view diagrams of a substrate displacing assembly, in accordance with some embodiments of the present disclosure.
Figure 2C:
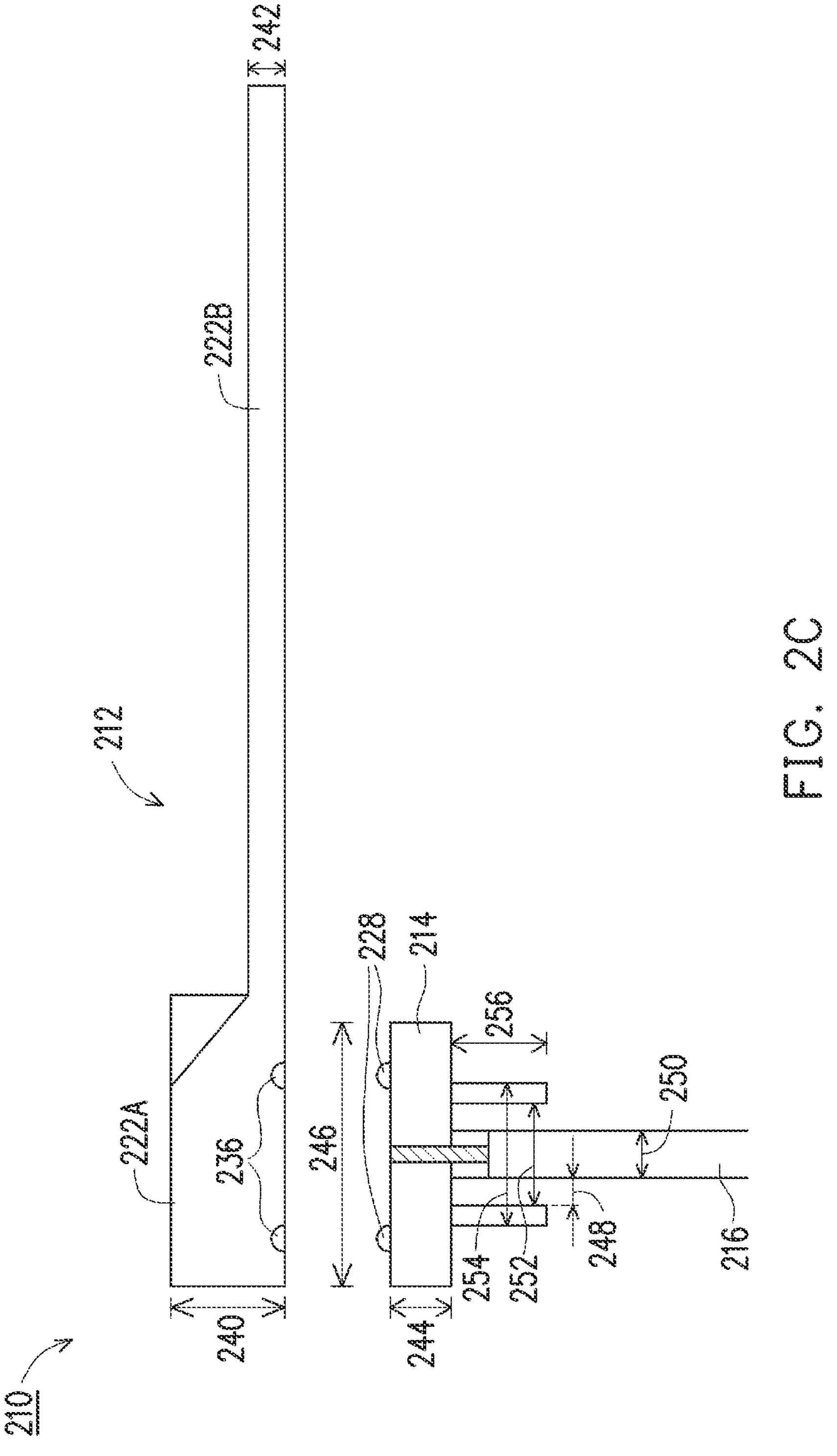

FIGS. 2B-2C illustrates exemplary perspective and side view diagrams of a substrate displacing assembly 210, in accordance with some embodiments of the present disclosure. In the illustrated embodiment, the substrate displacing assembly 210 comprises a pair of load forks 212, a coupler 214 and a driving shaft 216. In some embodiments, the pair of load forks 212 has an inner diameter 211A and an outer dimeter 211B. In some embodiments, the inner diameter 211A and the outer diameter 211B is configured so as to align with a substrate holder 204 and a plurality of pins 208. In some embodiments, the pair of load forks 212 has a unibody construction with a base region 222A and a fork region 222B. In some embodiments, the unibody of the pair of load forks 212 is made of inert materials, for example, ceramic, graphite and plastic to prevent introducing chemical contamination to the chamber 202 and to the semiconductor manufacturing process.

In some embodiments, the base region 222A is a region configured to be mechanically assembled with the coupler 214. In some embodiments, the unibody construction improves rigidity and reduces failure. In some embodiments, the base region 222A of the pair of load forks 212 has a first thickness 240 and the fork region 222B of the pair of load forks 212 has a second thickness 242. In some embodiments, the first thickness 240 is greater than the second thickness 242. In some embodiments, the first thickness is greater than 3 millimeters. In some embodiments, the first thickness 240 is 11.56 millimeters and the second thickness is 3.56 millimeters.

In the illustrated embodiments, the base region 222A comprises two mounting holes 226A. In some embodiments, the base region 222A further comprises two cutout regions 224. In some embodiments, each of the two mounting holes 226A extends from the tops surface to the back surface of the base region 222A for receiving joining screws 234. In some embodiments, the joining screws 234 mechanically couple the pair of load forks 212 to the coupler 214. In some embodiments, the back surface of the base region 222A further comprises two dent holes 236 for alignment purposes. In some embodiments, each of the two dent holes 236 has a bowl shape which is configured for receiving alignment pins 228 on the coupler 214.

Figure 3A:
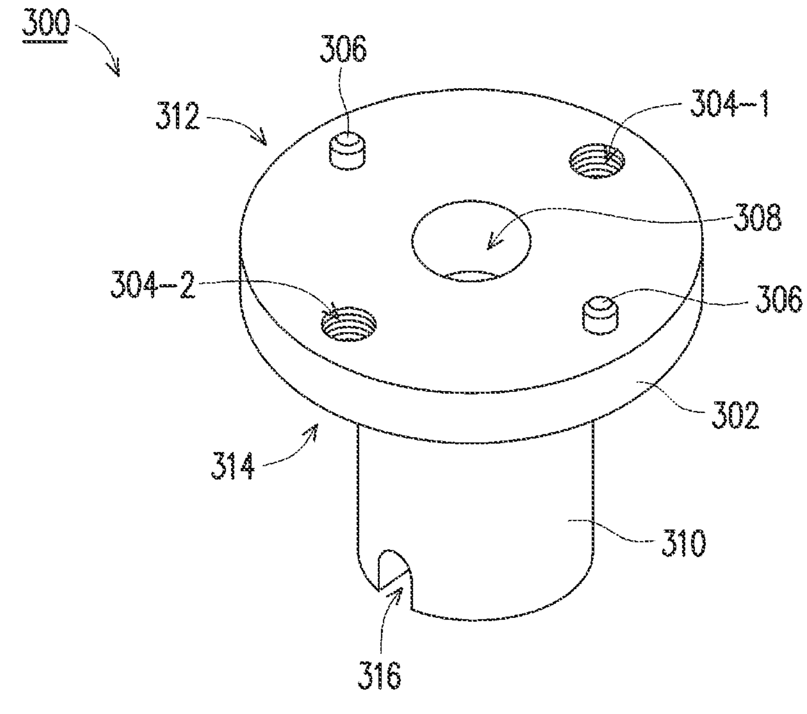
FIGS. 3A-3B illustrate exemplary perspective, top-view and side view diagrams of a coupler, in accordance with some embodiments of the present disclosure.

In the illustrated embodiment, the coupler 214 comprises a flange region 302 (FIG. 3A) and a tube region 310 (FIG. 3A). In some embodiments, the flange region 302 has a circular shape with a diameter 246 in the ranged of 40.0 to 45.0 millimeters, and preferably 42.0 millimeters, and a thickness 244 in the range of 4.0 to 6.0 millimeters, and preferably 5.0 millimeters. In some embodiments, the flange region 302 further comprises 3 mounting holes 226B and 230A, wherein the mounting holes 226B align with the mounting holes 226A on the pair of load forks 212 for receiving joining screws 234 and the mounting holes 230A for receiving a joining screw 232. In some embodiments, the mounting hole 230A extends from the top surface to the back surface of the flange region 302 so as to receive the joining screw 232, which is used to mechanically couple the coupler 214 with the driving shaft 216. In some embodiments, the joining screw 232 after the coupler 214 is fully coupled with the driving shaft 216, flushes with the top surface of the flange region 302. In some other embodiments, the joining screw 232 after the coupler 214 is fully coupled with the driving shaft 216, is lower than the top surface of the flange region 302.

In some embodiments, the flange region 302 further comprises 2 alignment pins 228 which, when in alignment with the pair of load forks 212, lock in position with the dent holes 236 on the back surface of the pair of load forks 212. In some embodiments, the tube region 310 under the flange region 302 has an inner diameter 252 in the range of 13.0 to 14.0 millimeters, and preferably 13.8 millimeters, an outer diameter 254 in the range of 20.0 to 22.0 millimeters, and preferably 21.0 millimeters, and a length 256 in the range of 25.0 to 26.0 millimeters, and preferably 25.4 millimeters. In some embodiments, the tube region 310 is coupled to the flange region 302 on a first end and the tube region is configured with a cutout region 238A on a second end for receiving a key 238B configured on the sidewall of the driving shaft 216. In some embodiments, the coupler 214 is made of metal, for example aluminum.

In the illustrated embodiment, the driving shaft 216 has a diameter 250 in a range of 12.0 to 13.0 millimeters, and preferably 12.68 millimeters. In some embodiments, the driving shaft 216 comprises a mounting hole 230B which aligns with the mounting hole 230A on the flange region of the coupler 214 for receiving the joining screw 232 to mechanically couple the coupler 214 and the driving shaft 216. In some embodiments, a clearance distance 248 between the inner wall of the tube 310 of the coupler 214 and the side wall of the driving shaft 216 is greater than 0.1 millimeters. In some embodiments, the clearance distance 248 is 0.65 millimeters. In some embodiments, the driving shaft 216 is made of metal, for example, aluminum.

Figure 3B:
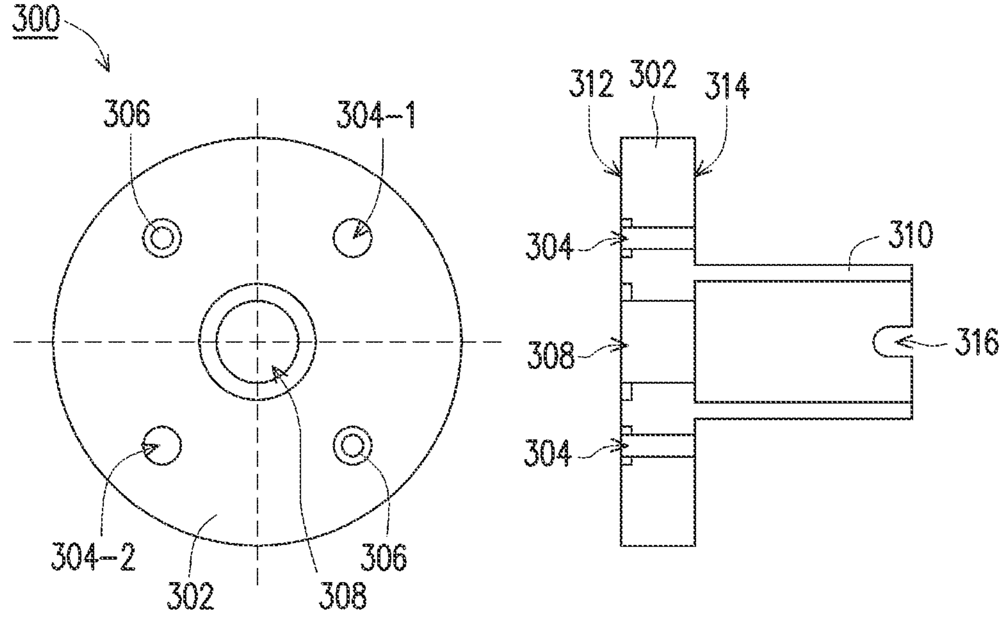

FIGS. 3A-3B illustrate exemplary perspective top-view and side view diagrams of a coupler 300, in accordance with some embodiments of the present disclosure. In the illustrated embodiment, the coupler 300 comprises a flange 302 and a tube 310. In some embodiments, the flange 302 has a circular shape. In some embodiments, the flange 302 further comprises 3 mounting holes 304-1, 304-2 and 308. In some embodiments, the mounting hole 308 is configured at the center of the flange 302 and extends from a first surface 312 to a second surface 314 of the flange 302. In some embodiments, the mounting hole 308 is configured to receive a joining screw so as to mechanically couple the coupler 300 to a driving shaft. In some embodiments, the mounting holes 304-1 and 304-2 are configured to align with mounting holes on a pair of load forks for receiving joining screws so as to mechanically couple the coupler 300 with the pair of load forks. In some embodiments, the mounting holes 304-1/304-2 extends from the top surface to the back surface of the flange region so as to receive the joining screw 232, which is used to mechanically couple the coupler 214 with the driving shaft 216. In some other embodiments, the mounting holes 304-1/304-2 are configured on the first surface 312 without extending to the second surface 314. In the illustrated embodiment, the flange 302 further comprises two alignment pins 306 on the first surface 312, which are configured to align with dent holes on the pair of load forks.

In some embodiments, the tube 310 of the coupler 300 is coupled with the flange 302 on a first end and is configured with a cutout region 316 on a second end. In some embodiments, the cutout region 316 is configured to receive a key pin on the driving shaft. In some embodiments, the coupler 300 has a unibody construction. In some embodiments, the coupler 300 is made of metal, for example, aluminum.

Figure 4:
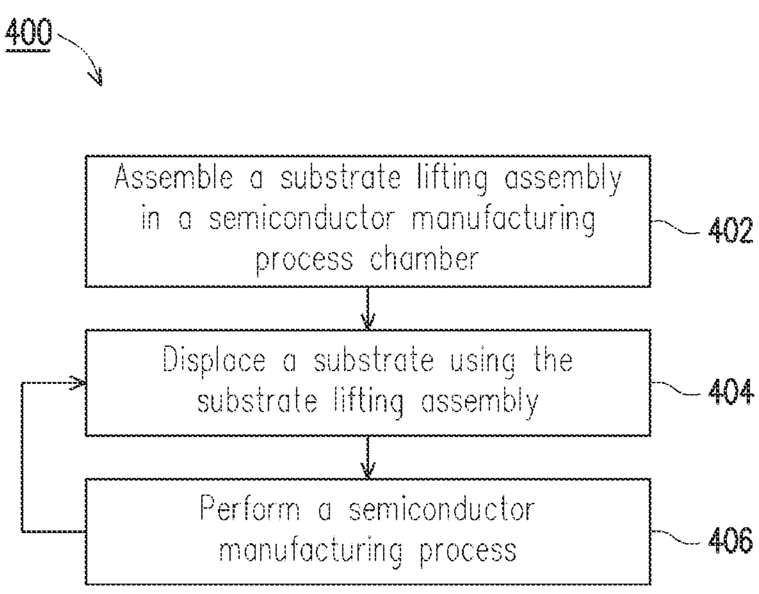
FIG. 4 illustrates a flow chart of a method to displace a substrate during a semiconductor manufacturing process, in accordance with some embodiments of present disclosure.

FIG. 4 illustrates a flow chart of a method 400 to displace a substrate during a semiconductor manufacturing process, in accordance with some embodiments of present disclosure. In some embodiments, the operations of method 400 are performed by the respective components illustrated in FIGS. 1-3. For purposes of discussion, the following embodiment of the method 400 will be described in conjunction with FIGS. 1-3. The illustrated embodiment of the method 400 is merely an example for holding a warped substrate on a vacuum chuck during a semiconductor processing. Therefore, it should be understood that any of a variety of operations may be omitted, re-sequenced, and/or added while remaining within the scope of the present disclosure.

The method 400 starts with operation 402 in which a substrate displacing assembly is assembled in a semiconductor manufacturing process chamber according to some embodiments. In some embodiments, the semiconductor manufacturing process chamber is in a semiconductor processing station 202 for performing an IC manufacturing process, as described above with respect to FIG. 1. Examples of the IC manufacturing processes conducted in the processing station include cleaning, photolithography, wet etching, dry etching, dielectric deposition, metal deposition, and any semiconductor processes known in the art. In some embodiments, the substrate displacing assembly can include the features of substrate displacing assembly 210 described above with reference to FIGS. 2A-3B.

The method 400 continues with operation 404 in which a substrate is displaced by the substrate displacing assembly 210 according to some embodiments. In some embodiments, the substrate 206 after being loaded in to the semiconductor manufacturing process chamber 202 is transferred to the substrate holder 204. In some embodiments, the substrate 206 is supported by a plurality of pins 208 configured on the substrate holder 204. In some embodiments, the substrate 206 is then set down on to the top surface of the substrate holder 204 by lowering the plurality of pins 208 using the pair of load forks 212. In some embodiments, the pair of load forks 212 is controlled by the driving mechanism 218 through the driving shaft 216 coupled by the coupler 214.

The method 400 continues with operation 406 in which a semiconductor manufacturing process is performed on the substrate 206 according to some embodiments. Examples of the semiconductor manufacturing process conducted in the chamber 202 includes at least one of the following: cleaning, photolithography, wet etching, dry etching, dielectric deposition, metal deposition, and any other semiconductor processes known in the art. In some embodiments, the chamber 202 is for depositing a semiconductor layer on the semiconductor substrate 206 using a chemical vapor deposition (CVD) process.

The method 400 continues with operation 406 in which the substrate is further displaced by the substrate displacing assembly 210 according to some embodiments. In some embodiments, after the semiconductor manufacturing process is completed on the substrate 206, the substrate 206 is then lifted from the substrate holder 204 by the plurality of pins 208 which is pushed up in the y direction using the pair of load forks 212 in the substrate displacing assembly 210. In some embodiments, the substrate 206 is removed from the semiconductor manufacturing process chamber for further processing or measurement.

In one embodiment, a semiconductor manufacturing system, includes, a substrate holder, wherein the substrate holder is configured with a plurality of pins; and a substrate displacing assembly for displacing a substrate on the substrate holder in a first direction perpendicular to the top surface of the substrate holder through the plurality of pins, wherein the substrate displacing assembly comprises a pair of load forks, a coupler and a driving shaft, wherein the pair of load forks comprises a fork region and a base region, wherein the coupler is mechanically coupled to the base region through at least one first joining screw extending in the first direction, wherein the coupler is further mechanically coupled to the driving shaft through a second joining screw extending in the first direction.

In another embodiment, substrate displacing assembly for displacing a substrate on a substrate holder, includes, a pair of load forks, wherein the pair of load forks comprises a fork region and a base region; a coupler, wherein the coupler comprises a flange region and a tube region, wherein the coupler is mechanically coupled to the base region through at least one first joining screw extending in a first direction; and a driving shaft, wherein the driving shaft is mechanically coupled to the coupler through a second joining screw extending in the first direction.

Yet, in another embodiment, method for handling a semiconductor substrate, includes: assembling a substrate displacing assembly; displacing a substrate using the substrate displacing assembly in a first direction; and performing a semiconductor manufacturing process on the substrate, wherein the substrate displacing assembly comprises, a pair of load forks, a coupler, and a driving shaft, wherein the pair of load forks comprises a fork region and a base region, wherein the coupler comprises a flange region and a tube region, wherein the coupler is mechanically coupled to the base region through at least one first joining screw extending in the first direction; and wherein the driving shaft is mechanically coupled to the coupler through a second joining screw extending in the first direction.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A semiconductor manufacturing system, comprising:

a substrate holder, wherein the substrate holder is configured with a plurality of pins; and a substrate displacing assembly for displacing a substrate on the substrate holder in a first direction perpendicular to a top surface of the substrate holder through the plurality of pins, wherein the substrate displacing assembly comprises a pair of load forks, a coupler and a driving shaft, wherein the pair of load forks comprises a fork region and a base region, wherein the coupler is mechanically coupled to the base region through at least one first joining screw extending in the first direction, wherein the coupler is further mechanically coupled to the driving shaft through a second joining screw extending in the first direction.

2. The semiconductor manufacturing system of claim 1, wherein each of the plurality of pins extends outwardly from the top surface to a back surface of the substrate holder.

3. The semiconductor manufacturing system of claim 1, wherein a first thickness of the base region is greater than a second thickness of the fork region.

4. The semiconductor manufacturing system of claim 1, wherein the base region is configured with at least one first mounting hole, wherein each of the at least one first mounting hole extends from a top surface to a back surface of the base region, wherein the coupler comprises a flange region, wherein the flange region is configured with at least one second mounting hole, wherein each of the at least one second mounting hole align with each of the at least one first mounting hole for receiving the at least one first joining screw.

5. The semiconductor manufacturing system of claim 4, wherein the coupler further comprises a tube region, wherein the tube region is coupled to the flange region on a first end, wherein the tube region further comprises a cutout region on a second end, and wherein the tube region is configured to receive the driving shaft.

6. The semiconductor manufacturing system of claim 5, wherein the cutout region on the second end of the tube region of the coupler is to align with a key on the driving shaft.

7. The semiconductor manufacturing system of claim 1, wherein a clearance distance in a second direction, perpendicular to the first direction, between the inner wall of the tube region of the coupler to the side wall of the driving shaft is greater than 0.1 millimeters.

8. A semiconductor manufacturing system, comprising:

a substrate holder, wherein the substrate holder is configured with at least one pin; and a substrate displacing assembly for displacing a substrate on the substrate holder in a first direction perpendicular to a top surface of the substrate holder through the at least one pin, wherein the substrate displacing assembly comprises at least one load fork, a coupler and a driving shaft, wherein the at least one load fork comprises a fork region and a base region, wherein the coupler is mechanically coupled to the base region through at least one first joining screw extending in the first direction, wherein the coupler is further mechanically coupled to the driving shaft through a second joining screw extending in the first direction, and wherein a clearance distance in a second direction, perpendicular to the first direction, between an inner wall of the coupler to a side wall of the driving shaft is greater than 0.1 millimeters.

9. The semiconductor manufacturing system of claim 8, wherein the fork region is configured to align with the at least one pin and extends outwardly from the top surface to a back surface of the substrate holder so as to push the at least one pin in the first direction.

10. The semiconductor manufacturing system of claim 8, wherein a first thickness of the base region is greater than a second thickness of the fork region.

11. The semiconductor manufacturing system of claim 8, wherein the coupler comprises a flange region and a tube region, and is mechanically coupled to the base region, wherein the base region is configured with at least one first mounting hole, wherein the flange region is configured with at least one second mounting hole, wherein each of the at least one first mounting hole extends from a top surface to a back surface of the base region, and wherein each of the at least one second mounting hole align with each of the at least one first mounting hole for receiving the at least one first joining screw.

12. The semiconductor manufacturing system of claim 11, wherein the tube region is coupled to the flange region on a first end, wherein the tube region further comprises a cutout region on a second end, and wherein the tube region is configured to receive the driving shaft from the second end.

13. The semiconductor manufacturing system of claim 12, wherein the cutout region on the second end of the tube region of the coupler is to align with a key on the driving shaft.

14. A method for handling a semiconductor substrate, comprising:

providing a substrate holder;

providing a substrate displacing assembly for displacing a semiconductor substrate on the substrate holder in a first direction perpendicular to a top surface of the substrate holder displacing the semiconductor substrate using the substrate displacing assembly in a first direction; and performing a semiconductor manufacturing process on the semiconductor substrate, wherein the substrate displacing assembly comprises, a pair of load forks, a coupler, and a driving shaft, wherein the pair of load forks comprises a fork region and a base region, wherein the coupler is mechanically coupled to the base region, and the driving shaft is mechanically coupled to the coupler, and wherein a clearance distance in a second direction, perpendicular to the first direction, between an inner wall of the coupler to a side wall of the driving shaft is greater than 0.1 millimeters.

15. The method of claim 14, wherein the fork region of the pair of load forks is configured to align with a plurality of pins extends outwardly from the top surface to a back surface of the substrate holder so as to push each of the plurality of pins in the first direction.

16. The method of claim 14, wherein a first thickness of the base region is greater than a second thickness of the fork region.

17. The method of claim 14, wherein the coupler comprises a flange region and a tube region, wherein the base region is configured with at least one first mounting hole, wherein the flange region is configured with at least one second mounting hole, wherein each of the at least one first mounting hole extends from a top surface to a back surface of the base region, and wherein each of the at least one second mounting hole align with each of the at least one first mounting hole for receiving the at least one first joining screw.

18. The method of claim 17, wherein the tube region is coupled to the flange region on a first end, wherein the tube region further comprises a cutout region on a second end, wherein the tube region is configured to receive the driving shaft from the second end, and wherein the cutout region on the second end of the tube region of the coupler is to align with a key on the driving shaft.

19. The method of claim 14, wherein the coupler is mechanically coupled to the base region through at least one first joining screw extending in the first direction.

20. The method of claim 19, wherein the driving shaft is mechanically coupled to the coupler through a second joining screw extending in the first direction.

* * * * *